United States Patent [19]

Nishizawa

[11] Patent Number: 4,465,527
[45] Date of Patent: Aug. 14, 1984

[54] METHOD FOR PRODUCING A GROUP IIB–VIB COMPOUND SEMICONDUCTOR CRYSTAL

[76] Inventor: Jun-ichi Nishizawa, No. 6-16, Komegafukuro 1-chome, Sendai-shi, Miyagai-ken, Japan

[21] Appl. No.: 501,417

[22] Filed: Jun. 6, 1983

Related U.S. Application Data

[63] Continuation of Ser. No. 272,763, Jun. 11, 1981, abandoned.

[30] Foreign Application Priority Data

Jun. 11, 1980 [JP] Japan .................. 55-78620

[51] Int. Cl.$^3$ .......................................... H01L 21/208
[52] U.S. Cl. .................................. 148/171; 148/172; 29/569 L; 156/616 R
[58] Field of Search ............... 148/1.5, 171, 172, 177, 148/189; 29/569 L; 156/616 R, DIG. 77

[56] References Cited

U.S. PATENT DOCUMENTS 3,615,877 10/1971 Yamashita ................... 148/174 X
4,190,486 2/1980 Kyle ............................ 156/616 R

OTHER PUBLICATIONS

Periodic Table of The Elements, Sargent-Welch Scientific Co., Skokie, Ill., 1979.
Electronic Materials EFM-78-12 (1978), issued by The Institute of Electrical Engineers of Japan entitled: "Growth of ZnS, ZnSe From Solution Containing Te and Their Light-emitting Characteristics".
Journal of Crystal Growth, 31 (1975), pp. 215-222.

Primary Examiner—G. Ozaki
Attorney, Agent, or Firm—Cushman, Darby & Cushman

[57] ABSTRACT

A method for producing a Group II–VI compound semiconductor crystal containing a Group VI element other than Te by a temperature-difference method for growing the crystal from a solution containing Te, the Group VI element and a Group II–VI compound crystal source where Te is used as a major component of a solvent and the crystal is grown at a relatively low temperature by maintaining the vapor pressure of the VI group element at a predetermined value. This method can form a practical p-n junction by using two solutions, one containing a p-type additive and the other an n-type additive, and contacting a substrate successively with each of the solutions for a predetermined time length.

19 Claims, 12 Drawing Figures

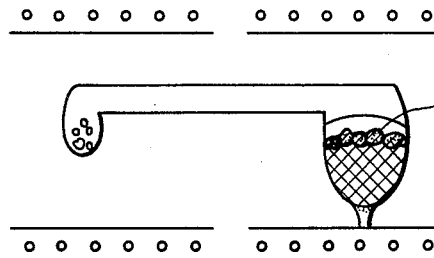
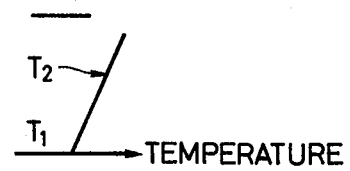
FIG. 7A    FIG. 7B
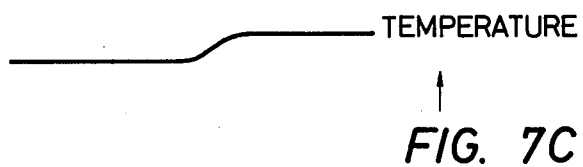
FIG. 7C
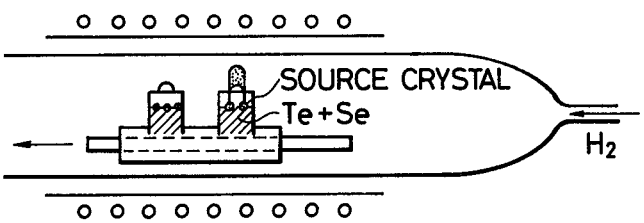
FIG. 8
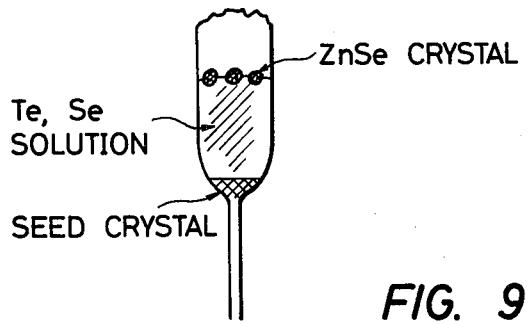
FIG. 9

METHOD FOR PRODUCING A GROUP IIB-VIB COMPOUND SEMICONDUCTOR CRYSTAL

This is a continuation of application Ser. No. 272,763 filed June 11, 1981, now abandoned.

BACKGROUND OF THE INVENTION (a) Field of the Invention:

The present invention relates to a method for producing a semiconductor crystal containing Group II–VI compounds. More particularly, the present invention relates to a method for growing a semiconductor crystal of such semiconductor compound as mentioned above through crystallization from a solution thereof.

(b) Description of the Prior Art:

Group II–VI compound semiconductors are of the direct transition type, and are characterized by having a wide energy band gap. Therefore, the Group II–VI compounds are attractive semiconductor materials having desirable unique properties which cannot be obtained in Group III–V compound semiconductor materials. Conduction types and energy band gaps of some of Group II–VI compound crystals are indicated in the following Table.

TABLE

|  | ZnS | ZnSe | ZnTe | CdS | CdSe | CdTe |
|---|---|---|---|---|---|---|
| Conduction Type | n | n | p | n | n | n p |
| Energy Band Gap (ev) | 3.6 | 2.8 | 2.2 | 2.5 | 1.74 | 1.5 |

Since research has not been made of Group II–VI compound semiconductors so extensively as for the Group III–V compound semiconductors, one has not been able to make full use of the unique properties of the II–VI compound semiconductors as yet. Typical Group II–VI compound semiconductors are ZnSe and ZnS. These compound semiconductors require a more strict control of their vapor pressure in carrying out their crystal growth than that of Group III–V compound semiconductors, because any one of II–VI compound semiconductor crystals has melting points higher than those of the Group III–V compound semiconductor crystals, and both elements which compose Group II–VI compound semiconductors have high vapor pressures. Whereas, in the case of Group III–V compound semiconductors only one element of these two components has a high vapor pressure. For the crystal growth of Group II–VI compound semiconductor crystals, an attempt has been made heretofore to grow a crystal from a melt thereof at a high temperature under a high pressure. In general, grown crystals have a deviation from stoichiometric composition. No counter-method for preventing such deviation from stoichiometry has been taken in the prior art. Another attempt which has been made heretofore is to grow the II–VI compound semiconductor crystal from a solution thereof. Such solution growth method has been most widely employed in the production of Group III–V compound semiconductor crystals which can be grown at a relatively low temperature. The application of the solution growth method to the production of Group II–VI compound semiconductor crystals has not been so extensively developed, and only very few attempts therefor have been reported. This may be attributed to the fact that Group II–VI compound semiconductors have a low solubility in a melt of one of its two component elements, and that both elements have a relatively high vapor pressure, so that it is difficult to carry out the solution growth method which requires the use of a melt of one component serving as a solvent in the growth of Group II–VI compound semiconductor crystal, although it is natural that the solution method is most suitable for growing a crystal containing no extra impurities. For example, in case of compound semiconductor ZnSe, it has a low solubility in a melt of component Zn or Se serving as a solvent, and either component has a relatively high vapor pressure, so that it is difficult to apply the solution growth method where the component is used as a solvent. Alternatively, there has been proposed another type of solution method where Te is used as a solvent for the reasons that Te is an element having a lower vapor pressure among Group VI elements and that ZnSe, ZnS and the like have a higher solubility in the melt of Te. According to this method, however, the resulting crystals are of the type of a mixed crystal containing a several percent of Te and having a ternary composition such as is noted from $ZnSe_{1-x}Te_x$, $ZnS_{1-x}Te_x$ and the like.

For simplicity, the following description is directed to a ZnSe single crystal, and solution growth method. It should be appreciated, however, that this discussion may apply to other Group II–VI compound semiconductor crystals. ZnSe has an energy band gap of 2.8 eV, and will act as a blue color light-emitting diode having a high efficiency, if a p-n junction is formed therein. In case ZnSe contains several percent of Te, the resulting crystal will be a mixed crystal of a composition of $ZnSe_{1-x}Te_x$ which has a narrower band gap incapable of emitting blue color light, and a tendency to easily generate defects in the crystal due to the presence of irregular strains. Such irregular strains are caused by a large difference in atomic radius between Te and Se. It is desirable, therefore, to obtain a crystal having as low a content of Te as possible so that the crystal may be substantially regarded as ZnSe. However, even when the semiconductor crystal obtained has a composition substantially equal to ZnSe, it has generally a large amount of Se lattice vacancies produced due to a high vapor pressure of Se. The lattice vacancies act as donors. Therefore, only n-type semiconductor crystals have been commonly produced, and no practical p-n junction has been obtained. Moreover, Se lattice vacancies combine impurities to form deep levels which act as non-radiative sites. Even when a p-n junction may be produced, it inevitably has a poor radiation efficiency due to the formation of deep levels. Therefore, there has been a need for a technique which makes it possible to produce semiconductor crystals having high crystal perfection that allows a practical p-n junction to be produced therefrom.

SUMMARY OF THE INVENTION

It is the object of the present invention to provide a method for producing Group II–VI compound semiconductors containing substantially no Te in a solution growth of a Group II–VI compound crystal using Te as a solvent, by controlling the deviation of the crystal from its stoichiometric composition by the addition, besides Te, of a Group VI element constituting the Group II–VI compound.

Another object of the present invention is to provide a method of the type as described above, which allows the use of a low growth temperature and to obtain the crystal having a high uniformity.

BRIEF DESCRIPTION OF THE DRAWINGS

FIGS. 7A, 7B and 7C are sketches showing a system for growing ZnSe crystal where a Se chamber is employed according to the present invention, in which:

FIGS. 7B and 7C are charts showing temperature distributions in the system as shown in FIG. 7A.

FIG. 8 is a sketch showing a system for effecting epitaxial depositions according to the present invention.

FIG. 9 is a sketch of an ampule containing seed semiconductor crystals besides Te, Se and ZnSe materials for effecting crystal deposition on the seed according to the present invention.

DETAILED DESCRIPTION OF THE PREFERRED EMBODIMENTS

The method of the present invention can effectively apply to the crystal growth of ZnSe, ZnS, CdS, CdSe and the like, especially ZnSe.

As used herein Group II-VI compounds all refer to compounds in subgroup B of the periodic table of the elements.

Figure 1:
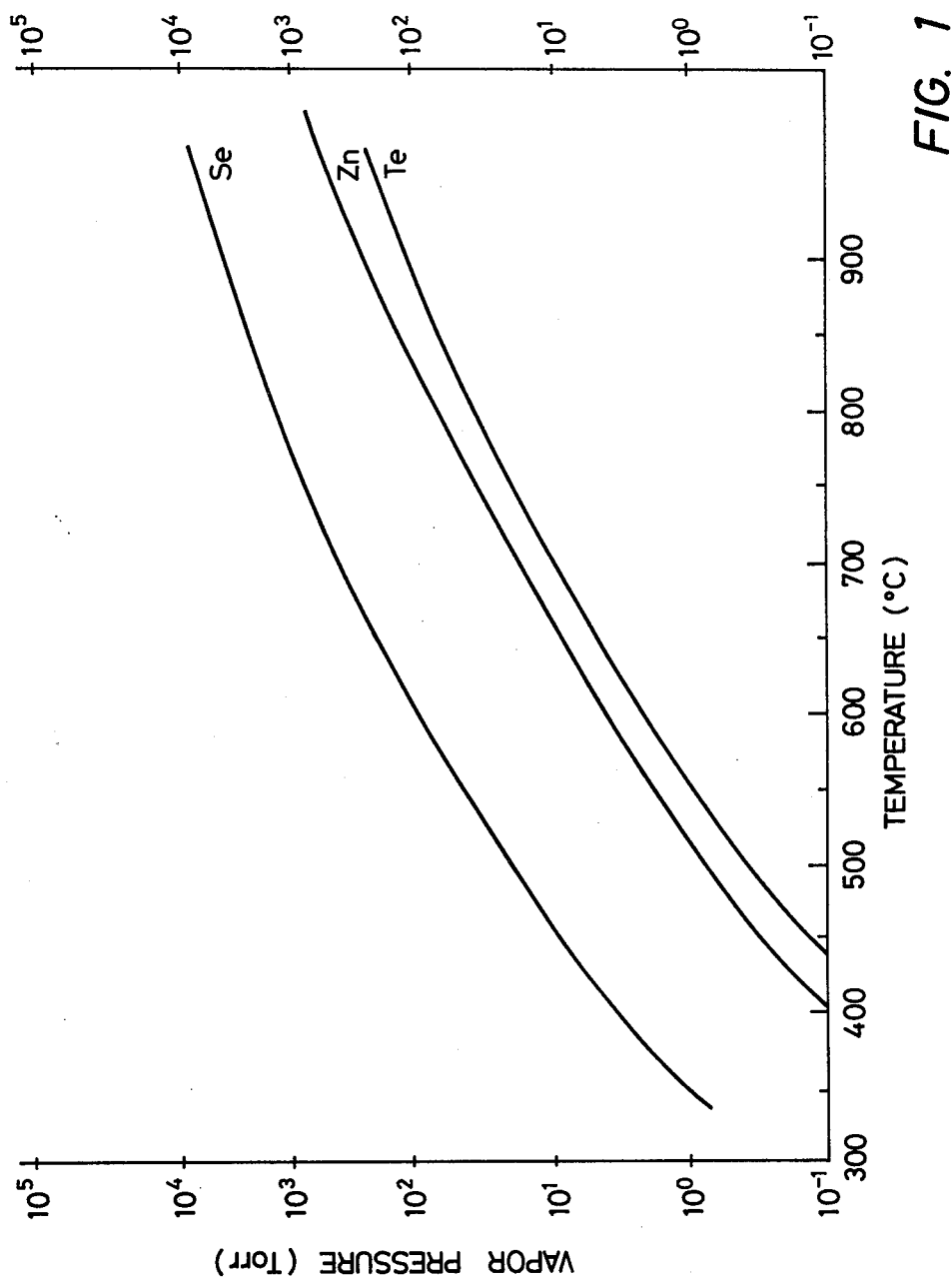
FIG. 1 is a chart showing a relationship between temperature and vapor pressure of an element such as Zn, Se and Te.

As to the solution-growth of ZnSe, no data of dissociation of pressures of Zn and Se from ZnSe have been reported. However, it can be estimated, by taking into account vapor pressure versus temperature curves as shown in FIG. 1, that Se would be dissociated more easily than Zn is. It is apparent that a ZnSe compound semiconductor crystal grown in Te solvent would be always a non-stoichiometric composition which is deficient in the amount of Se. In order to compensate for this deviation of Se amount from the stoichiometric composition and to produce a ZnSe crystal in which exist bonding Zn and Se atoms in a ratio of 1:1 according to the law of integer proportion, not only a ZnSe material alone but also a Se element is added to the solution of element Te. The resulting Te-Se mixed solution is used as a solvent, whereby the deviation from stoichiometric composition can be controlled. Thus, this method is effective to control the crystallinity and the type of conductivity.

Known slow-cooling methods can produce a crystal by lowering the temperature of a melt so that the solubility of solutes which have been dissolved in a solvent is reduced. In this case, the amount of the deposited crystal cannot become greater than the amount of the solute which has been dissolved at a higher temperature before the lowering of temperature is started. Therefore, the cooling method cannot lower the crystal growth temperature to a great extent. By using Te as a solvent and ZnSe as a Group II-VI semiconductor material to be introduced into the Te solvent according to the prior art, there is produced a ZnSe crystal containing about a few percent of Te, which crystal has to be deemed as a mixed crystal, $ZnSe_{1-x}Te_x$, from the consideration as to physical properties such as energy band gap and the like. In contrast thereto, the temperature-difference method for growing a crystal in a liquid phase can achieve continuous crystal deposition at a low temperature region, because a constant diffusion of solutes is continuously performed from a higher temperature region toward the lower temperature region. The amount of the deposited crystal increases in proportion to the growth time duration. In the temperature-difference method, unlike the cooling method, it should be appreciated that, owing to such proportion as mentioned above, practical crystal growth can be achieved at a much lower temperature than that required in the cooling method. For example, in case of ZnSe, the cooling method commonly employs a temperature of 1100° C. or higher even where only dendritic crystals can be produced, whereas the temperature-difference method employs a temperature of about 1100° C. to 800° C. to produce a bulk semiconductor crystal of about 1cm$^3$ and, in case of epitaxial deposition, about 800° C. to 500° C. to grow sufficiently an epitaxial crystal layer having a thickness of only a few microns or more. In this way, the temperature-difference method can conduct the crystal growth at a sufficiently lower temperature than that used in the cooling method. The amount of Te which is introduced into the growing crystal during crystal deposition, i.e., in the form of segregation factor of Te, is drastically reduced in exponential proportion to the reciprocal of temperature to such an extent that the Te content is 1% or lower, and the presence of Te cannot be detected by the Electroprobe-Microanalysis (EPMA) method or the lattice constant method. The grown crystal may naturally contain a trace or Te so that it may be said to have a composition of $ZnSe_{1-x}Te_x$ in the thermodynamic phase diagram. For practical applications such as of luminescent diodes, however, the grown crystal according to the present invention may be regarded as ZnSe with respect to very important parameters such as energy band gap, energy band structure, impurity level, impurity diffusion coefficient and impurity segregation coefficient. That is, Te can be regarded only as an impurity in ZnSe crystal. In case of silicon which may contain a large quantity of impurity, the impurity concentration may amount to as much as about one percent. Similarly, a ZnSe crystal having a Te content of 1% or less may practically be regarded as ZnSe. Moreover, a Te impurity belongs to the same group as Se from the electrical point of view, and it is altogether inert.

In practice, the EPMA method has failed to detect the presence of Te in a ZnSe crystal grown at a temperature of 1000° C. or lower, so that the content of Te has been estimated not higher than about 0.1% by taking into account the accuracy of the EPMA method.

According to the prior crystal growth method for producing Group III-V compound semiconductors under controlled vapor pressure, Group III elements, e.g., Ga or In, are used as a solvent, and the vapor pressure of the Group V element employed is controlled. In contrast thereto, according to the crystal growth method of the present invention for producing Group II-VI compound semiconductors, a Group VI element is used as the main solvent and the vapor pressure of same is controlled.

Figure 2:
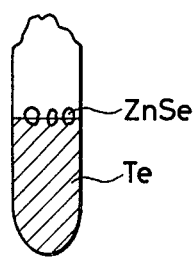
FIG. 2 is a sketch of an ampule containing Te and ZnSe materials according to the prior art.

FIG. 2 is a sketch of a system used in the prior art method for producing a ZnSe crystal. A quartz ampule 1 contains a source crystal of ZnSe in a solvent of Te. After alloying at 1200° C., the whole quartz ampule is cooled at a cooling rate of 10° to 30° C./hr. to precipitate a ZnSe crystal. The resulting ZnSe crystal has a yellow color and a very high resistivity of about $10^6 \Omega$cm. One cannot obtain a p-type crystal even by an addition of an impurity.

Figure 3:
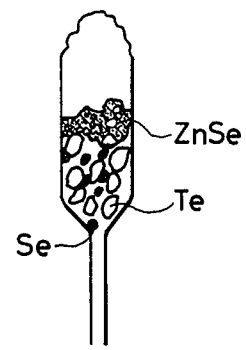
FIG. 3 is a sketch of an ampule containing Te, Se and ZnSe materials according to the present invention.

FIG. 3 is a sketch of a system which may be employed in the present invention. A quartz ampule 2 contains a source crystal of ZnSe floating on the surface of a Te solvent into which 1 to 30 atom percent of Se is added. As a ratio of Se to Te is increased, the vapor pressure of Se becomes higher. Thus, the composition of crystals to be precipitated can be stoichiometrically controlled by controlling this ratio. A thin quartz pipe 3 as a heat sink is connected to the lower end of the ampule to control the temperature of the system so that the temperature of a region at which crystallization commences is at the lowest. The tip of the ampule has a conical shape, an angle of which is preferably about 30° to 80°, most preferably about 60°, to facilitate the formation of a single crystal.

Figure 4A:
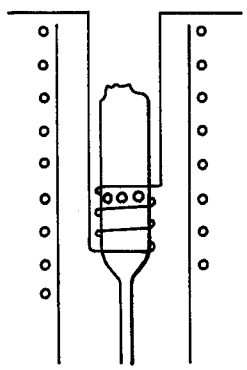
FIGS. 4A and 4B are sketches for illustrating the methods for establishing a temperature difference.
Figure 4B:
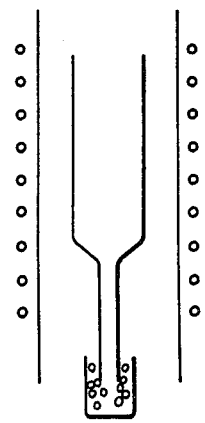
Figure 5:
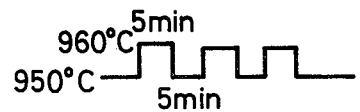
FIG. 5 is a chart showing a temperature cycle for controlling the temperature of a melt at the commencement of crystal growth.
Figure 6:
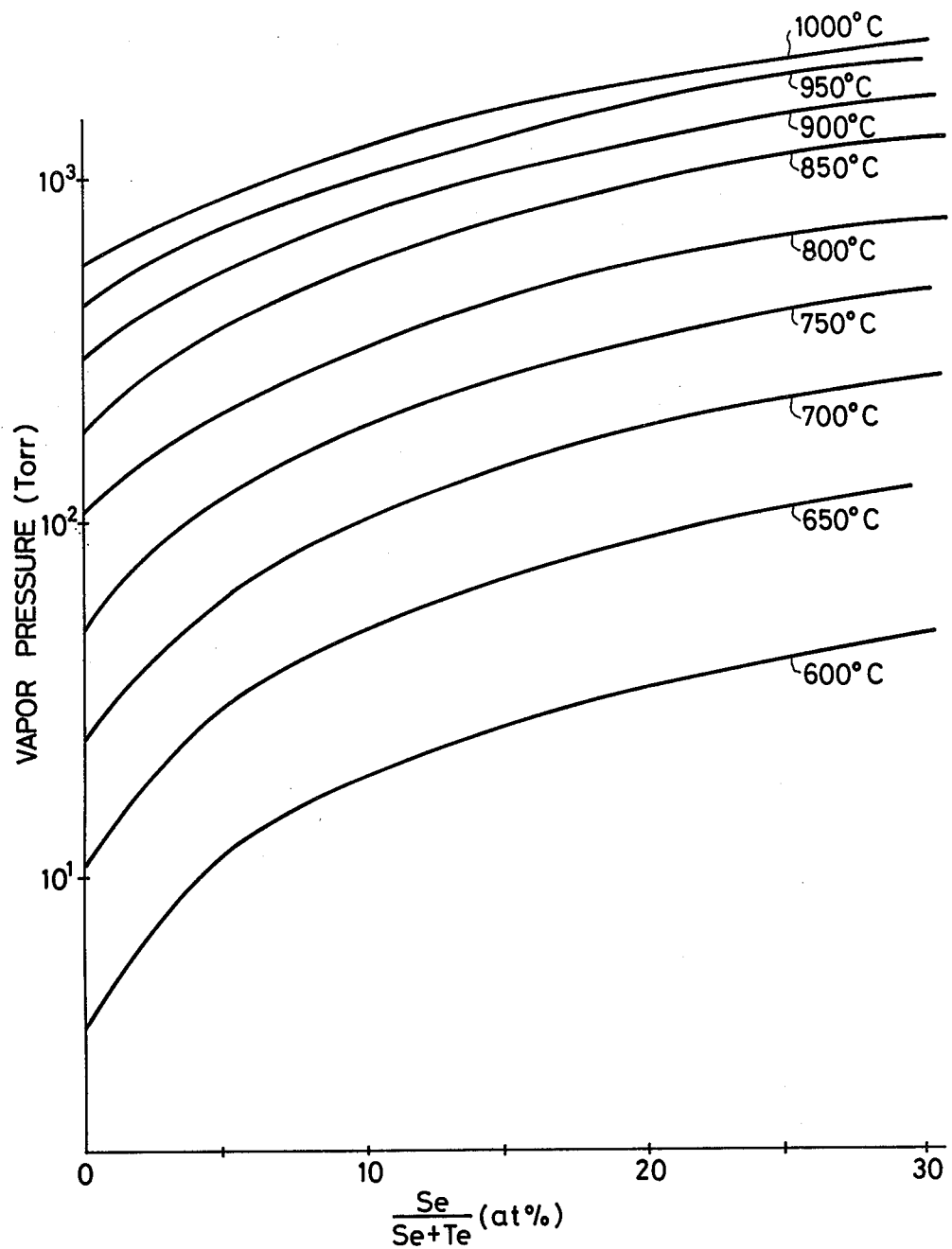
FIG. 6 is a chart showing the relationship between crystal growth temperature and vapor pressure of a solution.

The crystal precipitation is effected by the temperature-difference method where the temperatures of the system are controlled so that the main furnace 4 is maintained at a constant temperature, and the source crystal-floating region is at a higher temperature than that at the tip of the ampule so as to cause diffusion of the source element to the crystal to be precipitated. The temperature difference cannot be determined exactly in the solution, but it can be observed to be about 10° to 50° C. along the wall of the ampule. In addition to the use of a main heater, the temperature difference may be established by applying an alternating current through a heater wire or strip such as Kanthal (which is the commercial name) wire which is wound around the outside of the ampule wall above the central level of the melt as shown in FIG. 4A. Alternatively, the lower portion of the heat sink may be cooled by inserting it into a cooling medium such as ice as shown in FIG. 4B to provide a temperature difference. Alternatively, the temperature difference may be established by flowing $N_2$ gas or air into the heat sink so as to cool the lower portion of the melt. In any case, the quartz ampule is placed in a region of the main furnace where the ampule is heated at an average temperature relative to the temperature distribution owing to the use of a main heater alone or where the lower portion of the ampule is heated at a slightly lower temperature. The quartz ampule may be prepared by charging a quartz tube with Te, Se and ZnSe crystal after evacuating the inside of the tube to a pressure of $5 \times 10^{-6}$ Torr and fusing a part of the tube, simultaneously removing an excess portion thereof and closing the tube. After the ampule is placed in the furnace, it is heated gradually by powering the main heater to reach a crystal growth temperature, preferably, about 950° C. and lasting for about one whole day. After this temperature is reached, the temperature of the ampule is controlled to establish a temperature difference of 10° C. to 30° C. Then, the amount of power current applied to the main heater is changed up and down so that the temperature of the crystal growth region is changed in a manner as shown in FIG. 5. Such operation allows crystal nuclei to grow. Thereafter, the crystal growth region is kept at a constant crystal growth temperature for about one week. In case 6 g of Te, 0.1 g of Se (Se/Te+Se=2.62 wt. %) and 1.25 g of ZnSe are charged in a quartz ampule having an inside diameter of 10 mm, a bulk semiconductor crystal of a conical shape having a height of about 1.2 cm is obtained. The color of the crystal thus grown changes from yellow to reddish-brown depending upon the amount of Se added. Thus, about 0.5 g of Se produces yellow color, and 1.25 g produces reddish-brown color, indicating apparently the variation of the stoichiometric composition of the crystal. The relationship between the crystal growth temperature and the vapor pressure of the solution is shown in FIG. 6. Since the vapor pressure of Se alone is higher than that of Te, the vapor pressure of the solution (Se+Te) increases with the amount of Se added. When a quartz tube having an ordinary wall thickness is employed, the vapor pressure preferably should be limited to 3 to 5 atm. (2280 to 3800 Torr) at most and therefore, the crystal growth temperature preferably should be 1100° C. or lower. However, 1000° C. or lower is more preferred since the amount of Te in the crystal is relatively increased to above 1000° C. The lower the temperature is, the more the crystallinity is improved, but the solubility in the solvent becomes lowered, so that the growth rate will be decreased. Therefore, the temperature of the crystal growth is selected through compromise between the crystallinity and the growth rate. For the bulk growth requiring a high growth rate, a preferable temperature is between 800° C. and 1100° C., and an optimum temperature is in the range from 900° C. to 950° C.

The charge of Se should be controlled so that a molar ratio of Se to Te in the solvent should preferably be about 0.5 at. % to 30 at. %, more preferably about 1 at. % to 15 at. %. As the amount of Se becomes larger, the deficiency of Se in the ZnSe crystal will reduce accordingly, but the vapor pressure of Se will increase to create a risk of fracture of the quartz tube. Therefore, the amount of Se to be added is limited.

In this way, the addition of Se into the solution realizes a solution which is relatively deficient in Zn and, by adding further a Group I element such as Ag or Au, and such element effectively takes the place of Zn in the crystal to produce a p-type crystal.

The control of Se vapor pressure may be achieved to some extent by selecting a proportion of Se to be introduced into the solution. It may be expected, however, that the Se pressure will decrease gradually with the progress of reaction of Se and Te. For a more strict control, there may be provided a chamber for Se alone which communicates with the crystal growth region through a thin quartz tube. The temperatures of both the chamber and the crystal growth region are controlled independently of the main furnace. Such system makes it possible to control strictly the vapor pressure during the crystal growth. Specific temperature and vapor pressure of the Se chamber may be determined from the curve shown in FIG. 1. pressure is 30 to 300 Torr in the growth chamber, namely, vapor pressure of solvent ranges 10 Torr for Te to 300 Torr for Se at 700° C. from FIG. 6. More particularly, in case solvent contains Se and Te, the vapor pressure of the solvent, preferably, is selected to be 100 Torr for Se. This value is increased with an increase in the crystal growth temperature.

The temperature distribution established in the crystal growth region is such that, similarly to the cases shown in FIGS. 2 and 3, the temperature of the crystal-precipitating region $T_1$ is lower than the temperature at the level of the floating source crystals T₂ as shown in FIG. 7B. With respect to the relation in temperature between the Se chamber and the crystal growth region, it is natural to arrange that the temperature of said chamber is held lower than that of said region as shown in FIG. 7C.

The present invention has been explained heretofore in connection with the method where crystal nuclei are produced spontaneously or by applying the temperature cycle as shown in FIG. 5, and the crystals are deposited on the nuclei as sources. Alternatively, an epitaxial growth can be effected on a crystal substrate by placing the substrate in the crystal-precipitating region. As an example, a case wherein the crystal growth is conducted in a gaseous atmosphere will be illustrated hereinunder, though either vacuum or gaseous atmosphere may be employed. In a graphite well as shown in FIG. 8 are introduced 6 g of Te, about 0.5 g of Se, and ZnSe source crystals are introduced in a similar manner as in the preceding example, where the source crystals are floating on the surface of the resulting solution. A lid of the well and a slider accommodating the substrates should be in precise contact with the well in order to prevent the high vapor-pressure component from scattering out of the well. The melt is heated and maintained at a temperature of about 700° C. The temperature difference is produced by the input power of a heater means wound around the crucible well. After the melt of the alloy attained in an equilibrium state, the slider is moved to place the crystal substrate just below the melt. Supersaturated ZnSe located in the lower portion of the melt is epitaxially deposited on the substrate to grow a ZnSe crystal. As the gaseous atmosphere, an inert gas such as $H_2$, $N_2$ or Ar may be used. Alternatively, a vacuum may be used. Of course, it is also possible to effect the epitaxial growth by employing a separate Se material as shown in FIG. 7 and by controlling the temperature, and hence the vapor pressure of Se. Moreover, continuous epitaxial deposition can be achieved by providing two wells and by moving a substrate successively through the wells, with the substrate being kept in contact with each of the melts during each epitaxial deposition. In this case, when one of the wells contains an n-type inducing material and the other p-type material, a p-n junction can be formed on the substrate. FIG. 9 illustrates an example wherein seeds are charged in an ampule. For the epitaxial growth requiring a high crystal perfection, a lower crystal-growth temperature is preferred by taking into account vapor pressure and crystallinity, but the reduction of temperature is limited by the growth rate. A desired growth rate may be achieved at a temperature of 800° C. or lower, preferably 700° C. or lower, most preferably at 650° C. or lower. Even at 650° C. or lower, one can obtain epitaxially grown layers which are sufficiently capable of forming a p-n junction.

The present invention has been described in connection with the growth of a ZnSe crystal, but it should be appreciated, of course, that the method of the present invention can be applied equally effectively to the growth of ZnS, CdSe, CdS and the like. In case of CdSe, there is introduced Se into a solvent Te, whereas in case of ZnS or CdS, there is introduced S into the solvent Te. The only difference between the two instances lies in that a relatively high vapor pressure is controlled in the latter instance, because the vapor pressure of S is higher than that of Se.

What is claimed is:

1. A method for effecting solution growth of a Group IIB–VIB compound semiconductor containing at least one of ZnSe, ZnS, CdS and CdSe crystal using Te as a major component of the solvent, said method comprising the steps of:
    (1) to said solvent adding from about 0.5 to about 30 at. % of a group VIB element which is a component element of said IIB–VIB compound;
    (2) determining a vapor pressure for the growth based on the ratio of said Group VIB element to said solvent;
    (3) allowing a source crystal to float on the surface of said solvent, the amount of source crystal being greater than the solubility for the solvent at the growth temperature of said Group IIB–VIB compound semiconductor;
    (4) forming a temperature difference between the solvent and the source crystal so that the temperature of the solvent at the position of the source crystal is higher than the temperature in the lower portion of the solvent, while controlling the temperature in the lower portion of the solvent by adjusting the heat flow through a heat sink; and
    (5) forming said compound semiconductor crystal, the crystal growth being preformed at a constant vapor pressure, at a constant temperature and at a constant position.

2. A method according to claim 1, wherein Au or Ag is added to said solvent to produce a p type substitute in place of the Group IIB element of the Group IIB–VIB compound semiconductor crystal.

3. A method according to claim 1, wherein said Group IIB–VIB compound semiconductor crystal substantially is ZnSe.

4. A method according to claim 1, wherein said crystal is epitaxially grown on a semiconductor crystal substrate.

5. A method according to claim 1, wherein said crystal is grown at a temperature of 1100° C. or lower.

6. A method according to claim 1, wherein said vapor pressure is maintained at a predetermined value by adding said Group VIB element which is a component of said Group IIB–VIB compound semiconductor crystal.

7. A method according to claim 6, wherein said Group IIB–VIB compound semiconductor crystal substantially is ZnSe.

8. A method according to claim 6, wherein said crystal is epitaxially grown on a semiconductor crystal substrate.

9. A method according to claim 6, wherein said crystal is grown at a temperature of 1100° C. or lower.

10. A method according to claim 6, wherein an element selected from a group consisting of Au and Ag is added to said solvent to produce at least one p-type Group IIB–VIB ZnS, ZnSe, CdS and CdSe compound semiconductor crystal.

11. A method according to claim 10, wherein said Group IIB–VIB compound semiconductor crystal substantially is ZnSe.

12. A method according to claim 11, wherein said crystal is epitaxially grown on a semiconductor crystal substrate.

13. A method according to claim 12, wherein said crystal is grown at a temperature of 1100° C. or lower.

14. A method according to claim 13, wherein said temperature is 800° C. or lower.

15. A method according to claim 11, wherein said crystal is grown at a temperature at 1100° C. or lower.

16. A method according to claim 11, wherein said crystal contains a Te content of 1% or less.

17. A method according to claim 11, wherein said crystal contains a Te content of 0.1% or less.

18. A method according to claim 10, wherein said crystal is epitaxially grown on a semiconductor crystal substrate.

19. A method according to claim 10, wherein said crystal is grown at a temperature of 1100° C. or lower.

* * * * *